United States Patent

Abys et al.

[11] Patent Number: 6,139,977
[45] Date of Patent: Oct. 31, 2000

[54] PALLADIUM SURFACE COATING SUITABLE FOR WIREBONDING AND PROCESS FOR FORMING PALLADIUM SURFACE COATINGS

[75] Inventors: Joseph Anthony Abys, Warren; Alan Blair, Murray Hill; Chonglun Fan, Basking Ridge, all of N.J.

[73] Assignee: Lucent Technologies Inc., Murray Hill, N.J.

[21] Appl. No.: 09/095,237

[22] Filed: Jun. 10, 1998

[51] Int. Cl.[7] .............................. B32B 15/00; C25D 5/10
[52] U.S. Cl. ........................ 428/615; 205/148; 205/265; 428/637; 428/668; 428/670; 428/671; 428/675; 428/680; 428/926; 428/935
[58] Field of Search .................... 428/615, 637, 428/668, 670, 671, 675, 680, 926, 935; 205/148, 265

[56] References Cited

U.S. PATENT DOCUMENTS

| | | | |
|---|---|---|---|
| 4,545,868 | 10/1985 | Martin et al. | 205/148 |
| 4,785,137 | 11/1988 | Samuels | 428/680 |
| 4,911,799 | 3/1990 | Abys, et al. | 205/265 |
| 5,675,177 | 10/1997 | Abys et al. | 257/666 |

Primary Examiner—John J. Zimmerman
Assistant Examiner—Robert R. Koehler
Attorney, Agent, or Firm—Richard J. Botos

[57] ABSTRACT

A surface finish which provides improved wirebonding performance for integrated circuit packages is disclosed. The surface finish which is formed on a substrate includes a palladium layer and one or more material layers. The one or more material layers are interposed between the substrate and the palladium layer. The palladium layer has a hardness that is less than about 500 ($KHN_{50}$) while at least one material layer has a hardness that is less than about 250 ($KHN_{50}$).

23 Claims, 4 Drawing Sheets

PALLADIUM SURFACE COATING SUITABLE FOR WIREBONDING AND PROCESS FOR FORMING PALLADIUM SURFACE COATINGS

FIELD OF THE INVENTION

The present invention relates to palladium surface coatings, and more particularly, to palladium surface coatings useful in packaging integrated circuit devices.

DESCRIPTION OF THE RELATED ART

Integrated circuit (IC) packages are protective enclosures within which are typically sealed an integrated circuit (IC) unit and a leadframe. The IC unit is attached to the leadframe. The leadframe electrically interconnects the IC unit to circuitry located outside of the IC package.

A leadframe 10 useful for integrated circuit packages is shown in FIG. 1. The leadframe 10 includes a mounting area 15 and a plurality of lead members 20. The lead members 20 extend away from locations 25 adjacent to the mounting area 15. An IC unit 30 is attached on the mounting area 15 of leadframe 10. Examples of IC units include integrated circuit chips and hybrid integrated circuit modules. Hybrid integrated circuit modules typically include one or more IC chips as well as other electronic components mounted on a plastic or ceramic carrier.

After the IC unit 30 is attached on the mounting area 15 of the leadframe 10, wire bonds 35 are formed between the IC unit 30 and the lead members 20. The wire bonds 35 electrically connect the IC unit 30 with the lead members 20. Wire bonds are typically made of gold and aluminum wires.

Some wire bonds are formed using thermosonic techniques. In thermosonic techniques, a wire 50 is threaded through a capillary 55, so an end of the wire protrudes therefrom, as shown in FIG. 2A. The end of the wire that protrudes from the capillary 55 is then melted by an electrical spark, forming a ball 60 just below the tip of the capillary 55, as depicted in FIG. 2B. After the ball 60 is formed, it is bonded to an IC unit 70 mounted on a portion of a leadframe 75, as shown in FIG. 2C. The ball 60 is bonded to the IC unit 70 by applying a vertical load on the ball 60, pressing it against the surface of the IC unit 70 while ultrasonically exciting the wire. As the ball 60 is pressed against the IC unit 70 the IC unit is heated. After the ball 60 is attached to the IC unit 70, the wire 50 is looped and a wedge bond 80 (crescent bond) is formed to the leadframe 75, as depicted in FIG. 2D. The wedge bond 80 is also formed by applying a vertical load to the portion of the wire 50 in contact with the lead frame 75, pressing it against the surface of the leadframe 75 while ultrasonically exciting the wire. As the wedge bond is formed the leadframe 75 is heated. After the wedge bond 80 is formed, the capillary 55 breaks the wire 50 so the wedge bond 80 covers a crescent-shaped area on the surface of the leadframe 75, as depicted in FIG. 2E.

Oxides on the leadframe surface interfere with the adhesion of wire bonds formed thereto. For example, wire bonds do not stick to oxides on the surface of a leadframe. Consequently, the surface finish of the leadframe plays an important role for packaging integrated circuits and should be oxide free.

Leadframes are made of a variety of materials. Suitable leadframe materials are selected for their mechanical strength, conductivity, machinability, formability, corrosion resistance, thermal expansion as well as their solderability and wirebondability. Although suitable leadframe materials include gold and palladium, the cost of these materials makes their use prohibitive for most applications.

To reduce manufacturing costs, many leadframes are made of materials such as copper and copper alloys. Examples of suitable copper alloys include alloy 151 (99.9 weight % copper, 0.1 weight % zirconium); alloy 194 (97.5 weight % copper, 2.35 weight % iron, 0.03 weight % phosphorous, 0.12 weight % zinc); and alloy 7025 (96.2 weight % copper, 3.0 weight % nickel, 0.65 weight % silicon, 0.15 weight % magnesium). However, the formation of reactive copper products (e. g., copper oxides) reduces the solderablity and wirebondability of leadframes made from such materials.

Typically, leadframes made of copper and copper alloys are coated with a layer of nickel. The nickel layer serves as a barrier to the formation of copper oxides on the surface of the leadframe. However, nickel also oxidizes in air, and such oxides are undesirable. Thus, a thin layer of a metal that does not oxidize is formed over the nickel layer to prevent oxide formation. Examples of these materials, typically referred to as "noble metals" include gold and palladium.

Nickel coatings formed on the leadframes using conventional electrodeposition techniques have a tendency to crack when the lead members of the leadframe are bent at angles of about 82 degrees to about 90 degrees with a radius of about 250 $\mu$m for connection to larger assemblies. When the nickel coatings crack, the layer of noble metal thereon also cracks exposing the underlying copper leadframe to oxygen, and potentially forming oxides thereon.

SUMMARY OF THE INVENTION

The present invention is directed to a surface finish which provides improved wirebonding performance for integrated circuit packages. The surface finish which is formed on a substrate includes a palladium layer and one or more material layers. The one or more material layers are interposed between the substrate and the palladium layer. The palladium layer has a hardness that is less than about 500 ($KHN_{50}$) while at least one material layer has a hardness that is less than about 250 ($KHN_{50}$). The term hardness as used in this disclosure describes the indentability of a material under a specified load. The term $KHN_{50}$ as used in this disclosure identifies the Knoop hardness number of a material under a 50 gram load.

Surface finishes including palladium layers with hardnesses less than about 500 ($KHN_{50}$) formed over a material layer or layers with hardnesses less than about 250 ($KHN_{50}$) are ductile. Such ductile layers typically do not crack during IC package assembly, preventing oxides from forming thereon. Oxide formation is undesirable.

The substrate is made of a material useful for an integrated circuit package. Examples of suitable substrate materials include copper or copper alloys, and nickel or nickel alloys.

The material layer or layers interposed between the substrate and the palladium layer are formed using any suitable method such as electroplating. An example of a suitable material layer includes nickel.

The palladium layer is formed over the material layer or layers by electroplating the substrate in a palladium bath that contains about 5 gm/l to about 20 gm/l of palladium. The palladium bath is maintained at a pH of about 7.0 to about 8.0. Palladium is plated over the material layer using a current density of about 5 Amps/ft$^2$ to about 150 Amps/ft$^2$, at a bath temperature of about 25° C. to about 65° C. The palladium bath is agitated at a speed of about 10 cm/sec to about 100 cm/sec.

The palladium bath optionally includes an additive which is usefull for controlling the hardness of palladium layers plated therefrom. Additives useful for controlling palladium layer hardness include many sulfur-containing organic compounds. Examples of additives usefull for controlling palladium layer hardness include benzenesulfonic acid and allyl phenyl sulfone.

The palladium layer preferably has a thickness greater than about 0.075 $\mu$m. Palladium layer thicknesses greater than about 0.075 $\mu$m prevent oxides from forming on the underlying material layers.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

The present invention is directed to a surface finish which provides improved wirebonding performance for integrated circuit packages. The surface finish which is formed on a substrate includes a palladium layer and one or more material layers. The one or more material layers are interposed between the substrate and the palladium layer. The palladium layer has a hardness that is less than about 500 ($KHN_{50}$) while at least one material layer has a hardness that is less than about 250 ($KHN_{50}$).

Surface finishes including palladium layers with hardnesses less than about 500 ($KHN_{50}$) formed over a material layer or layers with hardnesses less than about 250 ($KHN_{50}$) are ductile. Such ductile layers typically do not crack during IC package assembly, preventing oxides from forming thereon. Oxides on the surface finish are undesirable.

Figure 1:
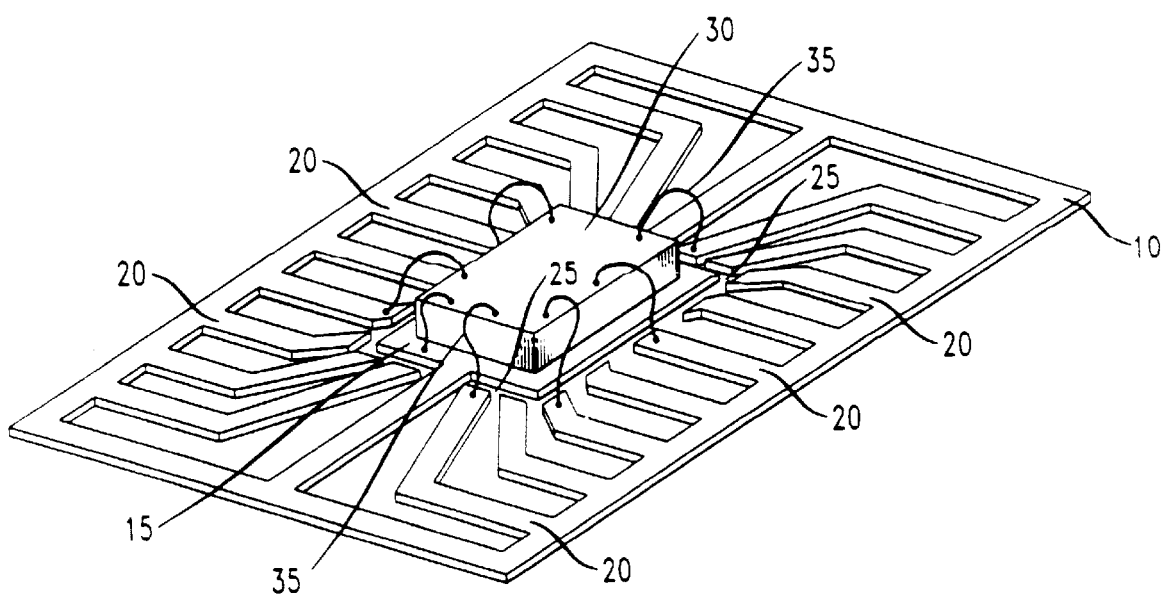
FIG. 1 shows a leadframe typically used for packaging integrated circuit devices.
Figure 2A:
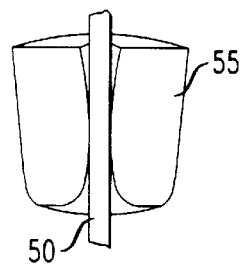
FIG. 2A depicts a portion of a thermosonic wirebonder wherein an end of a wire protrudes from a capillary.
Figure 2B:
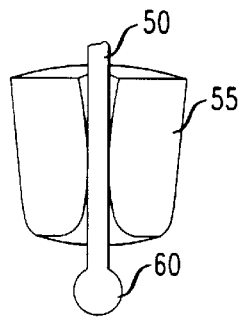
FIG. 2B illustrates how the protruding end of the wire is transformed into a ball.
Figure 2C:
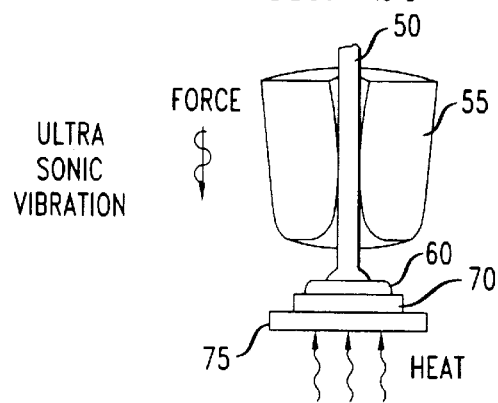
FIG. 2C shows the formation of a ball bond on an IC unit.
Figure 2D:
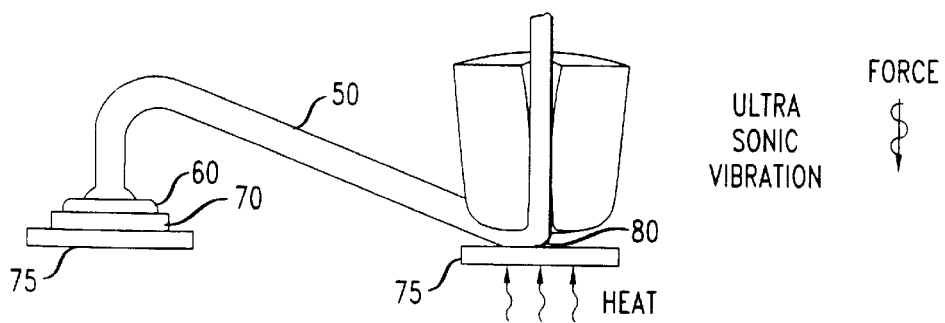
FIG. 2D shows the formation of a wedge bond on a leadframe.
Figure 2E:
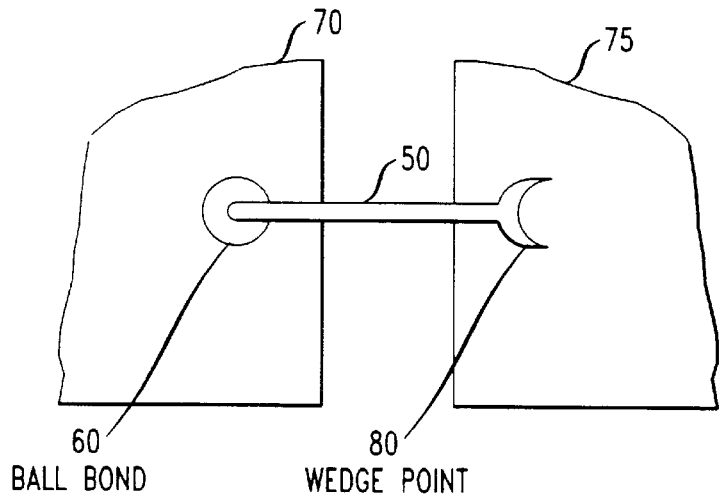
FIG. 2E illustrates a top view of the ball bond and the wedge bond.
Figure 3:
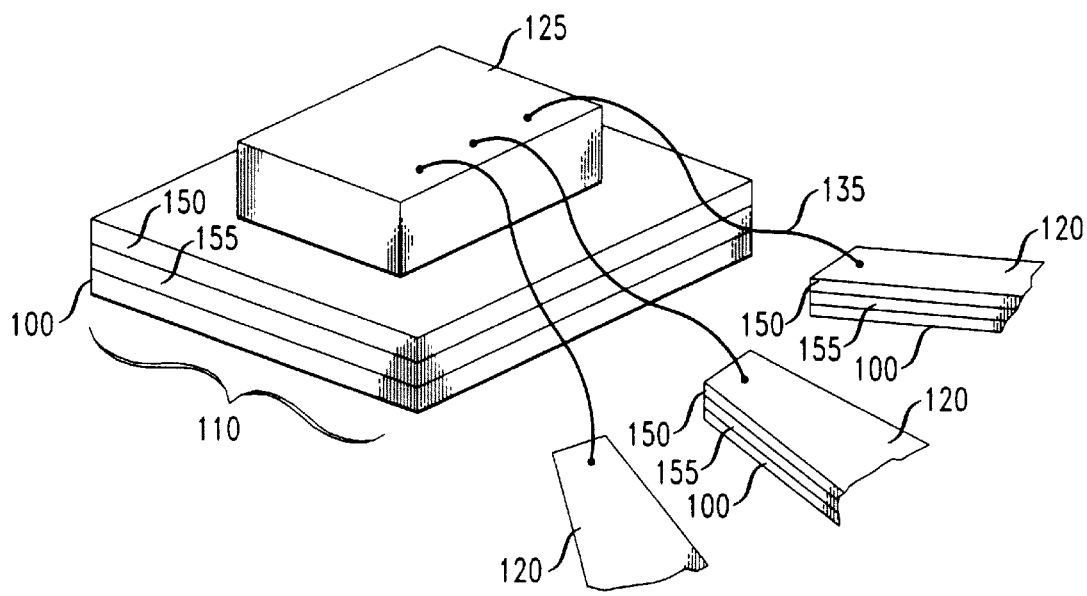
FIG. 3 shows a cross-sectional view of a substrate having a palladium layer of the present invention formed thereon.

FIG. 3 shows a cross-sectional view of a substrate 100 useful in integrated circuit packages. Substrate 100 has an IC mounting area 110 with a plurality of separate lead members 120 extending away from locations adjacent to the mounting area 110. An IC unit 125 is attached to mounting area 110. Wire bonds 135 formed between the IC unit 125 and the lead members 120 electrically connect the IC unit 125 with leadframe 100.

Substrate 100 is made of a material useful for an integrated circuit package. Examples of suitable substrate materials include copper or copper alloys, and nickel or nickel alloys.

As shown in FIG. 3, the material layer 155 or layers interposed between with the substrate 100 and the palladium layer 150 are formed using any suitable method such as electroplating.

For example, a nickel layer with a hardness less than about 250 ($KHN_{50}$) is electroplated on the substrate from a NikelTech MLS nickel bath containing about 100 gm/l to about 130 gm/l nickel. The nickel bath is maintained at a pH of about 2.0 to about 2.5. Nickel is plated on the substrate using a current density of about 50 Amps/ft$^2$ to about 300 Amps/ft$^2$ at a bath temperature of about 50° C. to about 65° C. It is advantageous if the bath is agitated at a speed of about 10 cm/sec to about 100 cm/sec. NikelTech MLS nickel baths are commercially available from Lucent Technologies Inc., Murray Hill, N.J.

The nickel layer has a thickness within the range of about 0.5 $\mu$m to about 5.0 $\mu$m.

A palladium layer 150 with a hardness less than about 500 ($KHN_{50}$) is formed on the at least one material layer 155. The palladium layer is formed on the material layer or layers by electroplating the substrate in a palladium bath that contains about 5 gm/l to about 20 gm/l of palladium. The palladium bath is maintained at a pH of about 7.0 to about 8.0. Palladium is plated on the at least one material layer using a current density of about 5 Amps/ft$^2$ to about 150 Amps/ft$^2$, at a bath temperature of about 25° C. to about 65° C. It is advantageous if the plating bath is agitated at a speed of about 10 cm/sec to about 100 cm/sec.

Palladium in the aqueous bath is a soluble species suitable for use in an electroplating process. Particularly useful are palladium complex ion compounds including palladium tetra-amine salts such as $Pd(NH_3)_4Cl_2$ and the corresponding bromides and iodides as well as other stable anions such as sulfates, and various palladium complexes in which the complexing agent is an organic compound such as an amine (see for example U.S. Pat. No. 4,911,799 which is hereby incorporated by reference). Also useful as a source of palladium are palladium complex hydroxides such as palladium hydroxide complexed with various organic compounds such as organic amines and polyamines (e.g. di-$\mu$-hydroxo-bis-[cis-diamine palladium (II)]).

Other compounds useful as a source of palladium for the aqueous bath include $PdCl_2$ and the corresponding bromide and iodide, as well as $PdSO_4$, and $Pd(NO_3)_2$. Halide palladium salts, including palladium halide complex salts (particularly chlorides) are preferred as are sulfate palladium salts because of stability and high solubility. Also, ammonia is preferred as the complexing agent (palladium amine salts) because of cost, availability, solubility and ease of removing the ammonia from the bath.

The palladium bath optionally includes an additive which controls the hardness of palladium layers plated therefrom. Additives which control the hardness of palladium layers plated from palladium baths include sulfur-containing organic compounds. Suitable examples are o-benzaldehydesulfonic acid, 1-naphthalene sulfonic acid, 2-naphthalenesulfonic acid, benzenesulfinic acid, oxy-4,4-bis(benzene)sulfinic acid, p-toluene sulfinic acid, and 3-trifluoromethyl benzene sulfinic acid. Additional additives include allyl phenyl sulfone, o-benzoic sulfamide, benzylsulfonyl propionamide, phenylsulfonyl acetamide, 3-(phenylsulfonyl) propionamide, benzene sulfonamide, bis (phenylsulfonyl) methane, guanidine carbonate, sulfaguanidine and nicotinic acid.

Figure 4:
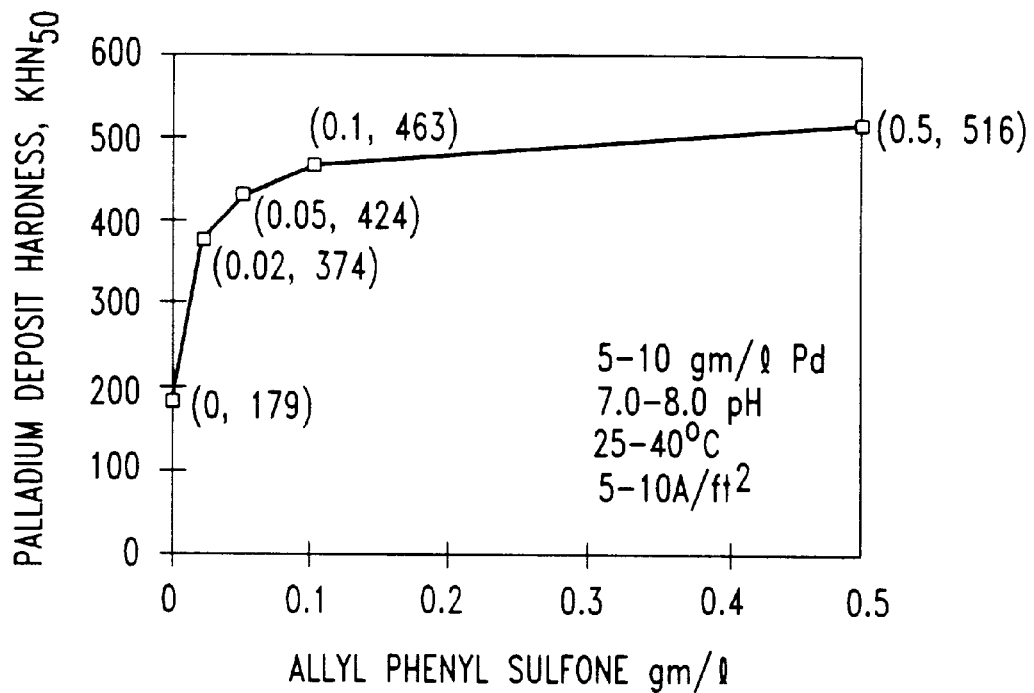
FIG. 4 shows a plot of the hardness of electroplated palladium layers as a function of the concentration of an additive (allyl phenyl sulfone) in the palladium plating bath.

The graph of FIG. 4 plots the hardness of electroplated palladium layers as a function of the concentration of an additive (allyl phenyl sulfone) in the palladium plating bath. The graph of FIG. 4 illustrates that electroplated palladium layers formed from palladium plating baths containing less than about 0.1 gm/l allyl phenyl sulfone have hardnesses ranging from about 180 ($KHN_{50}$) to about 460 ($KHN_{50}$).

The palladium layer preferably has a thickness greater then 0.075 µm. Additionally, a gold flash layer is optionally plated over the palladium layer. The gold flash layer preferably has a thickness of about 0.005 µm to about 0.075 µm.

Figure 5:
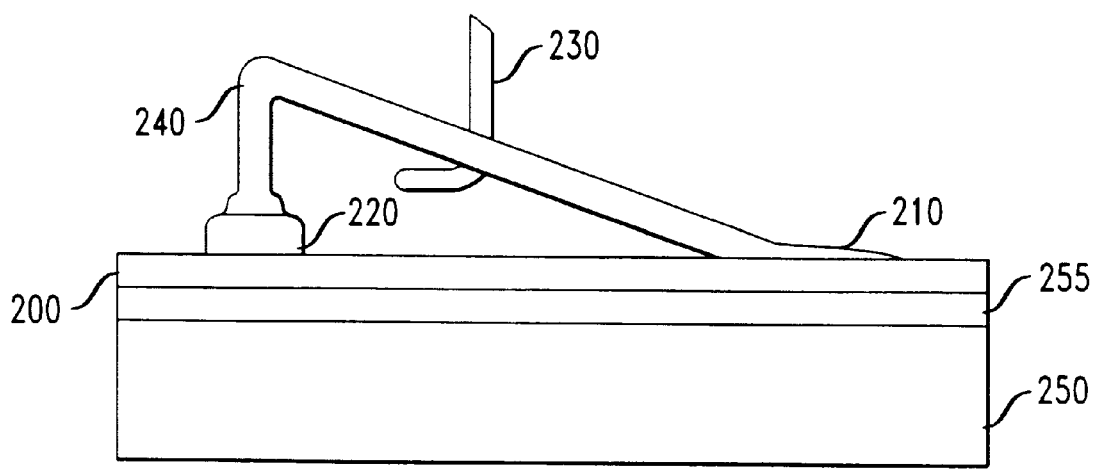
FIG. 5 shows a cross-sectional view of a wirebond undergoing a pull-test.

The wirebondability of the palladium surface finish is evaluated by performing pull-tests on wirebonds formed thereto, as shown in FIG. 5. Each wirebond includes both a ball bond 220 and a wedge bond 210 which are formed to a palladium layer 200. Interposed between the palladium layer 200 and a substrate 250 is a nickel layer 255. During the pull-test a force is applied to the wirebond, by pulling on the wire 240 with a steel hook 230. The force is increased until the wire 240 breaks or either of the ball 220 and wedge bond 210 lifts away from the palladium surface 200. Ideally, the wirebond should break along the length of the wire 240 instead of lifting away from the palladium surface 200 under either the ball bond 220 or the wedge bond 210.

A wirebondable surface is typically determined based on the number of bond failures resulting from nonadhesion of either the ball bonds or the wedge bonds on the palladium surface. For some applications, one bond failure identifies a palladium surface finish as a poor wirebonding surface.

Additionally, some industry standards require that the wirebond withstand a minimum pull force. For example, some industry standards require that wirebonds made using 25 µm diameter gold wire, with between about 3% to about 6% elongation and breaking load of about 8 grams to about 10 grams, withstand pull forces of at least about 5.00 grams. The term breaking load as used in this disclosure identifies the force above which a wire is expected to break when it is pulled laterally along its length.

The following examples are provided to illustrate specific embodiments of the present invention.

EXAMPLE 1

A 194 copper alloy leadframe was plated with a nickel layer. The 194 copper alloy leadframe was obtained from Olin Corporation, Norwalk, Conn.

The nickel was plated from a NikelTech MLS nickel bath containing about 120 g/l nickel. The nickel layer was plated with a current density of about 100 Amps/ft$^2$ at a temperature of about 60° C. and pH of about 2.2. A nickel layer about 2.5 µm thick was plated on the copper alloy leadframe. The nickel had a hardness of about 200 $KHN_{50}$. The NikelTech MLS nickel bath was obtained from Lucent Technologies, Murray Hill, N.J.

A palladium coating was formed over the nickel layer. The palladium was plated from a PallaTech PdLF palladium bath containing 5 gm/l palladium and about 0.5 gm/l of allyl phenyl sulfone. The palladium coating was plated with a current density of 10 Amps/ft$^2$ at a temperature of 22° C. and pH of 7.0. A palladium layer about 0.175 µm was plated over the nickel layer. The palladium coating had a hardness of about 516 $KHN_{50}$. The PallaTech PdLF palladium bath was obtained from Lucent Technologies, Murray Hill, N.J.

100 gold wire bonds were formed on the nickel/palladium coated leadframe. The gold wire had a diameter of 25 µm, with between 3% to 6% elongation, and a breaking load of about 8 grams to about 10 grams. The gold wire was obtained from Kulicke & Soffa Industries, Inc. (American Fine Wire, Packaging Materials Group), Selma, Ala. Pull tests were performed to test the strength of each wire bond. One wire bond did not adhere to the palladium surface. Pull-forces as low as 2.00 grams were found to remove wire bonds formed on the palladium coated leadframe.

EXAMPLE 2

A leadframe was plated with a conformable nickel layer. The nickel was plated according to the conditions described in Example 1.

A palladium coating was formed over the nickel layer. The palladium was plated from a PallaTech PdLF palladium bath containing 10 gm/l palladium and about 0.05 gm/l of allyl phenyl sulfone. The palladium coating was plated with a current density of 6 Amps/ft$^2$ at a temperature of 35° C. and pH of 7.5. A palladium layer about 0.175 µm thick was plated on the nickel layer. The palladium coating had a hardness of about 425 $KHN_{50}$.

100 gold wire bonds were formed on the nickel/palladium coated leadframe as described in Example 1. Pull tests were performed to test the strength of each wire bond. All wire bonds were adherent to the palladium surface. Pull-forces greater than about 5.90 grams were required to break the wire bonds formed on the nickel/palladium coated leadframe. The average pull force for the 100 pull-tests was about 7.72 grams. For each wire bond, the gold wire broke along the length of the wire rather than under either the ball bond or the wedge bond.

EXAMPLE 3

A leadframe was plated with a conformable nickel layer. The nickel was plated according to the conditions described in Example 1.

A palladium coating was formed over the nickel layer. The palladium was plated from a PallaTech PdLF palladium bath containing 25 gm/l palladium. The palladium coating was plated with a current density of 10 Amps/ft$^2$ at a temperature of 65° C. and pH of 8.0. A palladium layer about 0.175 µm thick was plated on the nickel layer. The palladium coating had a hardness of about 145 $KHN_{50}$.

100 gold wire bonds were formed on the nickel/palladium coated leadframe as described in Example 1. Pull tests were performed to test the strength of each wire bond. All wire bonds were adherent to the palladium surface. Pull-forces greater than about 6.16 grams were required to break the wire bonds formed on the nickel/palladium coated leadframe. The average pull force for the 100 pull-tests was about 7.80 grams. For each wire bond, the gold wire broke along the length of the wire rather than under either the ball bond or the wedge bond.

EXAMPLE 4

A leadframe was plated with nickel/palladium layers. The nickel and palladium layers were plated according to the conditions described in Example 2.

A gold flash was plated over the nickel/palladium layers. The gold flash was plated from a AuRoTech P gold bath containing 8 gm/l gold. The gold flash was plated with a current density of 1 Amps/ft$^2$ at a temperature of 55° C. and pH of 5.5. A gold flash about 0.025 µm thick was plated over the nickel/palladium layers. The AuRoTech P gold bath was obtained from Lucent Technologies, Murray Hill, N.J.

100 gold wire bonds were formed on the nickel/palladium/gold coated leadframe as described in Example 1. Pull tests were performed to test the strength of each wire bond. All wire bonds were adherent to the surface. Pull-forces greater than about 5.92 grams were required to break the wire bonds formed on the nickel/palladium coated leadframe. The average pull force for the 100 pull-tests was about 8.08 grams. For each wire bond, the gold wire broke along the length of the wire rather than under either the ball bond or the wedge bond.

The invention claimed is:

1. An article of manufacture, comprising:
   a substrate having at least one material layer formed thereon, wherein at least one material layer has a hardness less than about 250 ($KHN_{50}$); and
   a palladium layer formed on the at least one material layer, wherein the palladium layer has a hardness less than about 500 ($KHN_{50}$).

2. The article of claim 1 wherein the at least one material layer is a nickel layer having a thickness within the range of about 0.5 $\mu$m to about 5.0 $\mu$m.

3. The article of claim 1 wherein the substrate is made of a material selected from the group consisting of copper, copper alloys, nickel, and nickel alloys.

4. The article of claim 1 wherein the palladium layer is formed by electroplating the substrate in a palladium bath comprising about 5 gm/l to about 20 gm/l of palladium and maintaining the pH of the palladium bath in the range of about 7.0 to about 8.0 while applying a current density of about 5 Amps/ft$^2$ to about 150 Amps/ft$^2$ for a period of time sufficient to plate the layer of palladium of the desired thickness onto the substrate.

5. The article of claim 4 wherein the palladium bath further comprises an additive which controls the hardness of palladium layers plated therefrom.

6. The article of claim 5 wherein the additive is a sulfur containing organic compound.

7. The article of claim 6 wherein the sulfur containing compound is allyl phenyl sulfone.

8. The article of claim 7 wherein the palladium bath includes less than about 0.1 gm/l allyl phenyl sulfone.

9. The article of claim 4 wherein the palladium bath is maintained at a temperature of about 25° C. to about 65° C. while the substrate is electroplated.

10. The article of claim 4 wherein the palladium bath is agitated at a speed of about 10 cm/sec to about 100 cm/sec while the layer of palladium is electroplated on the substrate.

11. The article of claim 1 wherein the palladium layer has a thickness greater than about 0.075 $\mu$m.

12. The article of claim 1 wherein the substrate is a leadframe.

13. A method for electroplating a layer of palladium on a substrate comprising the steps of:
   providing a substrate with at least one material layer formed thereon, wherein at least one material layer has a hardness less than about 250 ($KHN_{50}$); and
   electroplating a layer of palladium on the at least one material layer, wherein the electroplated palladium layer has a hardness less than about 500 ($KHN_{50}$) and wherein the electroplated palladium layer is formed from a palladium bath comprising about 5 gm/l to about 20 gm/l of palladium and maintaining the pH of the palladium bath in the range of about 7.0 to about 8.0 while applying a current density of about 5 Amps/ft$^2$ to about 150 Amps/ft$^2$ for a period of time sufficient to plate the layer of palladium of the desired thickness onto the substrate.

14. The method of claim 13 wherein the palladium bath further comprises an additive which controls the hardness of palladium layers plated therefrom.

15. The method of claim 14 wherein the additive is a sulfur containing organic compound.

16. The method of claim 15 wherein the sulfur containing organic compound is allyl phenyl sulfone.

17. The method of claim 16 wherein the palladium bath includes less than about 0.1 gm/l allyl phenyl sulfone.

18. The method of claim 13 wherein the substrate is made of a material selected from the group consisting of copper, copper alloys, nickel, and nickel alloys.

19. The method of claim 13 wherein the palladium bath is maintained at a temperature of about 25° C. to about 65° C. while the substrate is electroplated.

20. The method of claim 13 wherein the palladium bath is agitated at a speed of about 10 cm/sec to about 100 cm/sec while the substrate is electroplated.

21. The method of claim 13 wherein the palladium layer has a thickness greater then about 0.075 $\mu$m.

22. The method of claim 13 wherein the at least one material layer is nickel having a thickness within the range of about 0.5 $\mu$m to about 5.0 $\mu$m.

23. The method of claim 13 wherein the substrate is a leadframe.

* * * * *